(12) United States Patent
Bencher

(10) Patent No.: US 7,148,156 B2
(45) Date of Patent: Dec. 12, 2006

(54) REMOVABLE AMORPHOUS CARBON CMP STOP

(75) Inventor: Christopher Dennis Bencher, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/053,193

(22) Filed: Feb. 8, 2005

(65) Prior Publication Data

US 2005/0191848 A1    Sep. 1, 2005

Related U.S. Application Data

(63) Continuation of application No. 10/383,839, filed on Mar. 7, 2003, now Pat. No. 6,852,647, which is a continuation of application No. 10/112,012, filed on Mar. 29, 2002, now Pat. No. 6,541,397.

(51) Int. Cl.
*H01L 21/31* (2006.01)
*H01L 21/469* (2006.01)

(52) U.S. Cl. ......... 438/780; 257/E21.27; 257/E21.277; 257/E21.579; 438/710; 438/725; 427/534; 427/536

(58) Field of Classification Search ................ 438/780, 438/789, 790, 710, 725; 427/534, 536
See application file for complete search history.

(56) References Cited

U.S. PATENT DOCUMENTS

| | | | |
|---|---|---|---|
| 4,486,286 A | 12/1984 | Lewin et al. | |
| 4,576,834 A | 3/1986 | Sobczak | |
| 4,717,622 A | 1/1988 | Kurokawa et al. | |
| 4,782,380 A | 11/1988 | Shankar et al. | |
| 4,789,648 A | 12/1988 | Chow et al. | |
| 4,957,591 A | 9/1990 | Sato et al. | |
| 4,975,144 A * | 12/1990 | Yamazaki et al. | 216/67 |
| 5,022,959 A | 6/1991 | Itoh et al. | |
| 5,087,959 A | 2/1992 | Omori et al. | |
| 5,091,339 A | 2/1992 | Carey | |
| 5,121,706 A | 6/1992 | Nichols et al. | |
| 5,221,414 A | 6/1993 | Langley et al. | |
| 5,232,871 A | 8/1993 | Ho | |
| 5,246,884 A | 9/1993 | Jaso et al. | |
| 5,360,491 A | 11/1994 | Carey et al. | |
| 5,397,558 A | 3/1995 | Miyanaga et al. | |

(Continued)

FOREIGN PATENT DOCUMENTS

DE    103 28 578    2/2004

(Continued)

OTHER PUBLICATIONS

Carter W. Kaanta, et al. "Dual Damascene: A Ulsi Wiring Technology," Jun. 11-12, 1991 VMIC Conference, pp. 144-152.

(Continued)

*Primary Examiner*—Alexander Ghyka
(74) *Attorney, Agent, or Firm*—Patterson and Sheridan

(57) ABSTRACT

A method is provided for processing a substrate including removing amorphous carbon material disposed on a low k dielectric material with minimal or reduced defect formation and minimal dielectric constant change of the low k dielectric material. In one aspect, the invention provides a method for processing a substrate including depositing at least one dielectric layer on a substrate surface, wherein the dielectric layer comprises silicon, oxygen, and carbon and has a dielectric constant of about 3 or less, forming amorphous carbon material on the at least one dielectric layer, and removing the one or more amorphous carbon layers by exposing the one or more amorphous carbon layers to a plasma of a hydrogen-containing gas.

20 Claims, 3 Drawing Sheets

U.S. PATENT DOCUMENTS

| | | | |
|---|---|---|---|
| 5,461,003 A | 10/1995 | Havemann et al. | |
| 5,470,661 A | 11/1995 | Bailey et al. | |
| 5,549,935 A | 8/1996 | Nguyen et al. | |
| 5,559,367 A | 9/1996 | Cohen et al. | |
| 5,589,233 A | 12/1996 | Law et al. | |
| 5,601,883 A | 2/1997 | Yamazaki et al. | |
| 5,616,368 A | 4/1997 | Jin et al. | |
| 5,635,423 A | 6/1997 | Huang et al. | |
| 5,674,355 A | 10/1997 | Cohen et al. | |
| 5,674,573 A | 10/1997 | Mitani et al. | |
| 5,679,267 A | 10/1997 | Belcher et al. | |
| 5,679,269 A | 10/1997 | Cohen et al. | |
| 5,691,009 A | 11/1997 | Sandhu | |
| 5,691,010 A | 11/1997 | Kuramoto et al. | |
| 5,700,626 A | 12/1997 | Lee et al. | |
| 5,710,067 A | 1/1998 | Foote et al. | |
| 5,720,808 A | 2/1998 | Hirabayashi et al. | |
| 5,744,865 A | 4/1998 | Jeng et al. | |
| 5,750,316 A | 5/1998 | Kawamura et al. | |
| 5,759,745 A | 6/1998 | Hollingsworth | |
| 5,759,913 A | 6/1998 | Fulford, Jr. et al. | |
| 5,773,199 A | 6/1998 | Linliu et al. | |
| 5,780,874 A | 7/1998 | Kudo | |
| 5,789,320 A | 8/1998 | Andricacos et al. | |
| 5,795,648 A | 8/1998 | Goel et al. | |
| 5,804,259 A | 9/1998 | Robles | |
| 5,824,365 A | 10/1998 | Sandhu et al. | |
| 5,830,332 A | 11/1998 | Babich et al. | |
| 5,830,979 A | 11/1998 | Nakayama et al. | |
| 5,837,331 A | 11/1998 | Menu et al. | |
| 5,866,920 A | 2/1999 | Matsumoto et al. | |
| 5,900,288 A | 5/1999 | Kuhman et al. | |
| 5,930,655 A | 7/1999 | Cooney, III et al. | |
| 5,930,669 A | 7/1999 | Uzoh | |
| 5,942,328 A | 8/1999 | Grill et al. | |
| 5,981,000 A | 11/1999 | Grill et al. | |
| 5,981,398 A | 11/1999 | Tsai et al. | |
| 5,986,344 A | 11/1999 | Subramanion et al. | |
| 5,989,623 A | 11/1999 | Chen et al. | |
| 5,989,998 A | 11/1999 | Sugahara et al. | |
| 5,998,100 A | 12/1999 | Azuma et al. | |
| 6,007,732 A | 12/1999 | Hashimoto et al. | |
| 6,008,140 A | 12/1999 | Ye et al. | |
| 6,020,458 A | 2/2000 | Lee et al. | |
| 6,025,273 A | 2/2000 | Chen et al. | |
| 6,030,901 A | 2/2000 | Hopper et al. | |
| 6,030,904 A | 2/2000 | Grill et al. | |
| 6,033,979 A | 3/2000 | Endo | |
| 6,035,803 A * | 3/2000 | Robles et al. | 118/723 E |
| 6,042,993 A | 3/2000 | Leuschner et al. | |
| 6,043,167 A | 3/2000 | Lee et al. | |
| 6,048,786 A | 4/2000 | Kudo | |
| 6,057,226 A | 5/2000 | Wong | |
| 6,057,227 A | 5/2000 | Harvey | |
| 6,064,118 A | 5/2000 | Sasaki | |
| 6,066,577 A | 5/2000 | Cooney, III et al. | |
| 6,078,133 A | 6/2000 | Menu et al. | |
| 6,080,529 A | 6/2000 | Ye et al. | |
| 6,087,064 A | 7/2000 | Lin et al. | |
| 6,087,269 A | 7/2000 | Williams | |
| 6,091,081 A | 7/2000 | Matsubara et al. | |
| 6,098,568 A | 8/2000 | Raoux et al. | |
| 6,124,213 A | 9/2000 | Usami et al. | |
| 6,127,263 A | 10/2000 | Parikh | |
| 6,140,224 A | 10/2000 | Lin | |
| 6,140,226 A | 10/2000 | Grill et al. | |
| 6,143,476 A | 11/2000 | Ye et al. | |
| 6,147,407 A | 11/2000 | Jin et al. | |
| 6,153,935 A | 11/2000 | Edelstein et al. | |
| 6,156,480 A | 12/2000 | Lyons | |
| 6,156,485 A | 12/2000 | Tang et al. | |
| 6,165,695 A | 12/2000 | Yang et al. | |
| 6,165,890 A | 12/2000 | Kohl et al. | |
| 6,183,930 B1 | 2/2001 | Ueda et al. | |
| 6,184,128 B1 | 2/2001 | Wang et al. | |
| 6,184,572 B1 | 2/2001 | Mountsier et al. | |
| 6,187,505 B1 | 2/2001 | Lin et al. | |
| 6,191,463 B1 | 2/2001 | Mitani et al. | |
| 6,203,898 B1 | 3/2001 | Kohler et al. | |
| 6,204,168 B1 | 3/2001 | Naik et al. | |
| 6,207,573 B1 | 3/2001 | Lee | |
| 6,211,065 B1 | 4/2001 | Xi et al. | |
| 6,214,637 B1 | 4/2001 | Kim et al. | |
| 6,214,730 B1 | 4/2001 | Cooney, III et al. | |
| 6,228,439 B1 | 5/2001 | Watanabe et al. | |
| 6,235,629 B1 | 5/2001 | Takenaka | |
| 6,245,690 B1 * | 6/2001 | Yau et al. | 438/780 |
| 6,259,127 B1 | 7/2001 | Pan | |
| 6,265,779 B1 | 7/2001 | Grill et al. | |
| 6,291,334 B1 | 9/2001 | Somekh | |
| 6,316,347 B1 | 11/2001 | Chang et al. | |
| 6,323,119 B1 | 11/2001 | Xi et al. | |
| 6,331,380 B1 | 12/2001 | Ye et al. | |
| 6,333,255 B1 | 12/2001 | Sekiguchi | |
| 6,346,747 B1 | 2/2002 | Grill et al. | |
| 6,352,922 B1 | 3/2002 | Kim | |
| 6,358,573 B1 | 3/2002 | Raoux et al. | |
| 6,380,106 B1 | 4/2002 | Lim et al. | |
| 6,413,852 B1 | 7/2002 | Grill et al. | |
| 6,423,384 B1 | 7/2002 | Khazeni et al. | |
| 6,428,894 B1 | 8/2002 | Babich et al. | |
| 6,458,516 B1 | 10/2002 | Ye et al. | |
| 6,498,070 B1 | 12/2002 | Chang et al. | |
| 6,514,587 B1 | 2/2003 | Fernandez-Kirchberger et al. | |
| 6,514,857 B1 | 2/2003 | Naik et al. | |
| 6,537,733 B1 | 3/2003 | Campana et al. | |
| 6,541,397 B1 | 4/2003 | Bencher | |
| 6,548,417 B1 | 4/2003 | Dao et al. | |
| 6,573,030 B1 | 6/2003 | Fairbairn et al. | |
| 6,596,465 B1 | 7/2003 | Mangat et al. | |
| 6,624,064 B1 | 9/2003 | Sahin et al. | |
| 6,635,583 B1 | 10/2003 | Bencher et al. | |
| 6,635,967 B1 | 10/2003 | Chang et al. | |
| 6,653,735 B1 | 11/2003 | Yang et al. | |
| 6,764,958 B1 | 7/2004 | Nemani et al. | |
| 6,841,341 B1 | 1/2005 | Fairbairn et al. | |
| 6,852,647 B1 | 2/2005 | Bencher | |
| 6,884,733 B1 | 4/2005 | Dakshina-Murthy et al. | |
| 2001/0007788 A1 | 7/2001 | Chang et al. | |
| 2002/0001778 A1 | 1/2002 | Latchford et al. | |
| 2002/0028551 A1 | 3/2002 | Jin et al. | |
| 2002/0086547 A1 | 7/2002 | Mui et al. | |
| 2002/0090794 A1 | 7/2002 | Chang et al. | |
| 2003/0091938 A1 | 5/2003 | Fairbairn et al. | |
| 2003/0148020 A1 | 8/2003 | Campana et al. | |
| 2003/0148223 A1 | 8/2003 | Campana et al. | |
| 2003/0186477 A1 | 10/2003 | Bencher | |
| 2004/0023502 A1 | 2/2004 | Tzou et al. | |
| 2004/0038537 A1 | 2/2004 | Liu et al. | |
| 2004/0166691 A1 | 8/2004 | Nieh et al. | |
| 2004/0180551 A1 | 9/2004 | Biles et al. | |
| 2004/0229470 A1 | 11/2004 | Rui et al. | |

FOREIGN PATENT DOCUMENTS

| | | |
|---|---|---|
| EP | 0 224 013 A2 | 6/1987 |
| EP | 0 381 109 | 8/1990 |
| EP | 0 387 656 A1 | 9/1990 |
| EP | 0 540 444 A1 | 5/1993 |
| EP | 0 560 617 A1 | 9/1993 |
| EP | 0 696 819 A1 | 2/1996 |
| EP | 0 701 283 A2 | 11/1996 |
| EP | 0 768 388 A2 | 4/1997 |
| EP | 0 901 156 | 3/1999 |

| | | |
|---|---|---|
| GB | 2 299 345 A | 10/1996 |
| JP | 02-135736 | 5/1990 |
| JP | 11-026578 | 1/1997 |
| JP | 09-045633 | 2/1997 |
| WO | WO 99/33102 A1 | 7/1999 |
| WO | WO 00/05763 | 2/2000 |

OTHER PUBLICATIONS

Endo, et al., "Preparation and Properties of Fluorinated Amorphous Carbon Thin Films by Plasma Enhanced Chemical Vapor Deposition", *Mat. Res. Symp. Proc.* vol. 381, Materials Research Society (1995), pp. 249-254.

Grill, et al., "Novel Low k Dielectrics Based on Diamondlike Carbon Materials", *J. Electrochem. Soc.* 145 (5) (1998).

Grill et al., "Diamondlike Carbon Films by RF Plasma-Assisted Chemical Vapor Deposition From Acetylene", IBM Journal of Research and Development, 34(6), 1990, p. 849-857.

Howard Landis, et al. "Integration of chemical—mechanical polishing into CMOS integrated circuit manufacturing," Thin Solid Films, 220 (1992), pp. 1-7.

Matsubara, et al., "Low-k Fluorinated Amorphous Carbon Interlayer Technology for Quarter Micron Devices", *IEDM* (1996), pp. 369-372.

Nguyen, et al. "A Novel Damascene Process for One Mask Via/Interconnect Formation," 1996 Symposium on VLSI Technology Digest of Technical Papers, pp. 118-119.

Rajiv V. Joshi, "A New Damascene Structure for Submicrometer Interconnect Wiring," Electron Device Letters, vol. 14, No. 3, Mar. 1993, pp. 129-132.

Robles, et al., "Characterization of High Density Plasma Chemical Vapor Deposited α-Carbon and α-Fluorinated Carbon Films For Ultra Low Dielectric Applications", *Int'l. Dielectrics for ULSI Multilevel Interconnection Conf.* (1997), 8 pages.

S. Lakshminarayanan, et al. "Contact and Via Structures with Copper Interconnects Fabricated Using Dual Damascene Technology," Electron Device Letters, vol. 15, No. 8 Aug. 1994, pp. 307-309.

T. Licata, et al. "Dual Damascene Al Wiring For 256M DRAM," Jun. 27-29, 1995 VMIC Conference, pp. 596-602.

Takeishi, et al., "Fluorocarbon Films deposited by PECVD with High thermal resistance and Low Dielectric Constants", *Semiconductor World* 16 (2) (1997), pp. 71-77.

CRC Handbook of Chemistry and Physics, 79th Edition (1998-1999), pp. 12-49 and 12-55.

European PCT International Search Report for PCT/US98/23888 Dated Mar. 3, 1999.

European Search Report for 01102401.5-1235, dated Jun. 9, 2004. (AMAT/4227.EP).

European Search Report for 01102401.5-1235, dated Apr. 13, 2005. (AMAT/4227.EP).

IBM Technical Disclosure Bulletin, Nov. 1993 "Damascene: Optimized Etch Stop Structure and Method", vol. 36; Issue 11, p. 649.

U.S. Appl. No. 10/768,724, filed on Jan. 30, 2004. (AMAT/8736).

U.S. Appl. No. 10/800,112, filed on Mar. 12, 2004 (AMAT/8245).

U.S. Appl. No. 10/799,147, filed on Mar. 12, 2004 (AMAT/8390).

Liu, et al., "Generating Sub-30nm Poly-Silicon Gates Using PECVD Amorphous Carbon as Hardmask and Anti-Reflective Coating", Proceedings of the SPIE, Bellingham, VA, US, vol. 5040, No. 1, Feb. 25, 2003, pp. 841-848.

PCT Notification of Transmittal of the International Search Report dated May 31, 2005 for PCT/US05/008070. (AMAT/8245PCT).

PCT Written Opinion dated May 31, 2005 for PCT/US05/008070. (AMAT/8245PCT).

PCT International Search Report for PCT/US05/005855 dated Oct. 13, 2005. (APPM/008244PC.02).

PCT Written Opinion for PCT/US05/005855 dated Oct. 13, 2005. (APPM/008244PC.02).

* cited by examiner

REMOVABLE AMORPHOUS CARBON CMP STOP

CROSS-REFERENCE TO RELATED APPLICATIONS

This application is a continuation of U.S. patent application Ser. No. 10/383,839, filed on Mar. 7, 2003 now U.S. Pat. No. 6,852,647, which application is a continuation of U.S. patent application Ser. No. 10/112,012, filed on Mar. 29, 2002 now U.S. Pat. No. 6,541,397, which applications are herein incorporated by reference.

BACKGROUND OF THE DISCLOSURE

1. Field of the Invention

The invention relates to the fabrication of integrated circuits and to a process for depositing dielectric layers on a substrate and the structures formed by the dielectric layer.

2. Description of the Related Art

One of the primary steps in the fabrication of modern semiconductor devices is the formation of metal and dielectric layers on a substrate by chemical reaction of gases. Such deposition processes are referred to as chemical vapor deposition or CVD. Conventional thermal CVD processes supply reactive gases to the substrate surface where heat-induced chemical reactions take place to produce a desired layer.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.18 µm feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constant (k)<4.0) to also reduce the capacitive coupling between adjacent metal lines. One such low k material is silicon oxycarbide deposited by a chemical vapor deposition process and silicon carbide, both of which may be used as dielectric materials in fabricating damascene features.

One conductive material having a low resistivity is copper and its alloys, which have become the materials of choice for sub-quarter-micron interconnect technology because copper has a lower resistivity than aluminum, (1.7 µΩ-cm compared to 3.1 µΩ-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, e.g., vias, and horizontal interconnects, e.g., lines. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material external to the etched pattern, such as on the field of the substrate, is then removed.

However, when low k material have been used in damascene formation, it has been difficult to produced features with little or no surface defects or feature deformation. It as been observed that low k dielectric materials are often porous and susceptible to being scratched and damaged during removal of conductive materials, which results in surface defects being formed on the substrate surface. Further, low k materials are often brittle and may deform under conventional polishing processes. One solution to limiting or reducing surface defects and deformation is to deposit a hardmask over the exposed low k materials prior to patterning and etching feature definitions in the low k materials. The hardmask is resistive to damage and deformation. The hardmask protects the underlying low k materials during subsequent material deposition and planarization or material removal processes, such as chemical mechanical polishing techniques or etching techniques, to reduce defect formation and feature deformation. The hardmask may then be removed following planarization prior to subsequent processing of the substrate.

One material of interest as a hardmask is amorphous carbon. Amorphous carbon has a low dielectric constant (i.e., k<4) and a sufficiently high resistance to removal from etching and polishing techniques to perform as a hardmask. However, hardmask removal processes comprise plasma-stripping processes containing oxygen, etching gases, such as $CF_4$, and inert gases. The underlying low k material is sensitive to damage from etching gases and inert gases during the stripping processes and is sensitive to oxygen contamination, which may result in surface defects in the underlying low k material as well as an increase in the dielectric constant of the low k material from oxygen contamination. Thus, such hardmask removal processes have been observed to produce dielectric stacks having a higher than desired dielectric constant.

Therefore, there remains a need for an improved process for depositing and removing layers disposed on low k dielectric materials with minimal effect of dielectric constants.

SUMMARY OF THE INVENTION

Aspects of the invention generally provide a method for removing one or more amorphous carbon layers disposed on a low k dielectric material with minimal or reduced defect formation and with minimal change in the dielectric constant of the low k dielectric material. In one aspect, the invention provides a method for processing a substrate including depositing at least one dielectric layer on a substrate surface, wherein the dielectric layer comprises silicon, oxygen, and carbon and has a dielectric constant of about 3 or less, forming one or more amorphous carbon layers on the at least one dielectric layer, and removing the one or more amorphous carbon layers by exposing the one or more amorphous carbon layers to a plasma of a hydrogen-containing gas.

In another aspect of the invention, a method is provided for processing a substrate including depositing at least one dielectric layer on a substrate surface, wherein the dielectric layer comprises silicon, oxygen, and carbon and has a dielectric constant of about 3 or less, forming one or more amorphous carbon layers on the at least one dielectric layer by providing a gas mixture to the deposition chamber, wherein the gas mixture comprises one or more hydrocarbon compounds have the general formula $C_xH_y$, wherein x has a range of 2 to 4 and y has a range of 2 to 10, and an inert gas and generating a plasma of the gas mixture to disassociate the one or more hydrocarbon compounds in the gas mixture to form an amorphous carbon layer on the substrate, and removing the one or more amorphous carbon layers by exposing the one or more amorphous carbon layers to a plasma of a hydrogen-containing gas.

In another aspect of the invention, a method is provided for processing a substrate depositing at least one dielectric layer on a substrate surface, wherein the dielectric layer comprises silicon, oxygen, and carbon and has a dielectric constant of about 3 or less, forming one or more amorphous carbon layers on the at least one dielectric layer, defining a pattern in at least one region of the one or more amorphous carbon layers, forming feature definitions in the at least one dielectric layer by the pattern formed in the at least one region of the one or more amorphous carbon layers, depositing one or more conductive materials in the feature definitions, polishing the one or more conductive materials and stopping on the one or more amorphous carbon layers, and removing the one or more amorphous carbon layers by exposing the one or more amorphous carbon layers to a plasma of a hydrogen-containing gas.

BRIEF DESCRIPTION OF THE DRAWINGS

So that the manner in which the above features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1A:
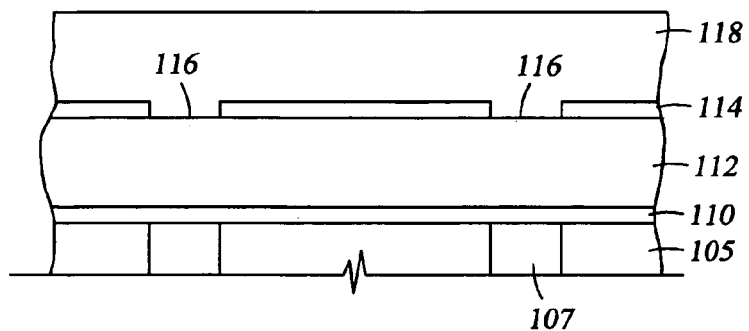
FIGS. 1A–1G are cross sectional views showing one embodiment of a dual damascene deposition sequence of the invention.

For a further understanding of aspect of the invention, reference should be made to the ensuing detailed description.

DETAILED DESCRIPTION OF THE PREFERRED EMBODIMENTS

Aspects of the invention generally provide a method for removing amorphous carbon material disposed on a low k dielectric material with minimal or reduced defect formation and minimal change in the dielectric constant of the low k dielectric material. The words and phrases used herein should be given their ordinary and customary meaning in the art by one skilled in the art unless otherwise further defined.

The amorphous carbon material may be removed by exposing the amorphous carbon material to a plasma of a hydrogen-containing gas. Low k material surfaces observed after removal of the amorphous carbon layer by the hydrogen-containing plasma have reduced surface defects compared to other removal processes with minimal change in the dielectric constant of the low k dielectric material thereunder.

The low k dielectric layer may be a silicon, oxygen, and carbon containing layer, such as a silicon oxycarbide layer. The silicon oxycarbide layer generally comprises between about 15 atomic % or greater of oxygen in the layer. The silicon oxycarbide layer may also contain hydrogen, nitrogen, or combinations thereof. The silicon oxycarbide layer is deposited by reacting an organosilicon compound to form a dielectric layer comprising carbon-silicon bonds and a dielectric constant less than about 3.

Suitable organosilane compounds include aliphatic organosilicon compounds, cyclic organosilicon compounds, or combinations thereof. Cyclic organosilicon compounds typically have a ring comprising three or more silicon atoms and the ring may further comprise one or more oxygen atoms. Commercially available cyclic organosilicon compounds include rings having alternating silicon and oxygen atoms with one or two alkyl groups bonded to the silicon atoms.

Aliphatic organosilicon compounds have linear or branched structures comprising one or more silicon atoms and one or more carbon atoms, and the structure may further comprise oxygen. Commercially available aliphatic organosilicon compounds include organosilanes that do not contain oxygen between silicon atoms and organosiloxanes that contain oxygen between two or more silicon atoms.

The carbon content of the deposited layers refers to atomic analysis of the layer structure that typically does not contain significant amounts of non-bonded hydrocarbons. The carbon contents are represented by the percent of carbon atoms in the deposited layer, excluding hydrogen atoms that are difficult to quantify. For example, a layer having an average of one silicon atom, one oxygen atom, one carbon atom, and two hydrogen atoms has a carbon content of 20 atomic percent (one carbon atom per five total atoms), or a carbon content of 33 atomic percent excluding hydrogen atoms (one carbon atom per three total atoms).

Organosilicon compounds contain carbon atoms in organic groups. Low dielectric constant layers are prepared from organosilicon compounds that have one or more carbon atoms attached to silicon wherein the carbon is not readily removed by oxidation at suitable processing conditions. Organic groups may include alkyl, alkenyl, cyclohexenyl, and aryl groups in addition to functional derivatives thereof.

Cyclic organosilicon compounds include, for example, one or more of the following compounds:

| | |
|---|---|
| 1,3,5-trisilano-2,4,6-trimethylene, | $-(-SiH_2CH_2-)_3-$ (cyclic) |
| 1,3,5,7-tetramethylcyclotetrasiloxane (TMCTS) | $-(-SiHCH_3-O-)_4-$ (cyclic) |
| Octamethylcyclotetrasiloxane (OMCTS), | $-(-Si(CH_3)_2-O-)_4-$ (cyclic) |
| 2,4,6,8,10-pentamethylcyclopentasiloxane, | $-(-SiHCH_3-O-)_5-$ (cyclic) |
| 1,3,5,7-tetrasilano-2,6-dioxy-4,8-dimethylene, | $-(-SiH_2-CH_2-SiH_2-O-)_2-$ (cyclic) |
| Hexamethylcyclotrisiloxane | $-(-Si(CH_3)_2-O-)_3-$ (cyclic) |

Aliphatic organosilicon compounds include for example, one or more of the following compounds:

| | |
|---|---|
| Methylsilane, | $CH_3-SiH_3$ |
| Dimethylsilane, | $(CH_3)_2-SiH_2$ |
| Trimethylsilane, | $(CH_3)_3-SiH$ |

-continued

| | |
|---|---|
| Dimethyldimethoxysilane, | $(CH_3)_2$—Si—$(OCH_3)_2$ |
| Ethylsilane, | $CH_3$—$CH_2$—$SiH_3$ |
| Disilanomethane, | $SiH_3$—$CH_2$—$SiH_3$ |
| bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3-dimethyldisiloxane, | $CH_3$—$SiH_2$—O—$SiH_2$—$CH_3$ |
| 1,1,3,3-tetramethyldisiloxane, | $(CH_3)_2$—SiH—O—SiH—$(CH_3)_2$ |
| Hexamethyldisiloxane (HMDS), | $(CH_3)_3$—Si—O—Si—$(CH_3)_3$ |
| 1,3-bis(silanomethylene) disiloxane, | $(SiH_3$—$CH_2$—$SiH_2$-$)_2$—O |
| bis(1-methyldisiloxanyl) methane, | $(CH_3$—$SiH_2$—O—$SiH_2$-$)_2$—$CH_2$ |
| 2,2-bis(1-methyldisiloxanyl) propane, | $(CH_3$—$SiH_2$—O—$SiH_2$-$)_2$—$C(CH_3)_2$, and |
| Hexamethoxydisiloxane (HMDOS) | $(CH_3O)_3$—Si—O—Si—$(OCH_3)_3$. |

The above list is illustrative and should not be construed or interpreted as limiting the scope of the invention.

In one aspect, a cyclic organosilicon compound and an aliphatic organosilicon compound are reacted with an oxidizing gas in amounts sufficient to deposit a low dielectric constant layer on a semiconductor substrate, wherein the cyclic organosilicon compound comprises at least one silicon-carbon bond. The aliphatic organosilicon compound contains a silicon-hydrogen bond or a silicon-oxygen bond, preferably a silicon-hydrogen bond. For example, the cyclic organosilicon compound may be 1,3,5,7-tetramethylcyclotetrasiloxane or octamethylcyclotetrasiloxane and the aliphatic organosilicon compound may be trimethylsilane or 1,1,3,3-tetramethyldisiloxane.

In another aspect, both the cyclic organosilicon compound and the aliphatic organosilicon compound contain a silicon-hydrogen bond. For example, 1,3,5,7-tetramethylcyclotetrasiloxane and trimethylsilane or 1,1,3,3-tetramethyldisiloxane are blended and oxidized while applying RF power.

Generally, the organosilicon compounds are reacted in a plasma comprising a relatively inert gas, preferably a noble gas, such as helium or argon, or nitrogen ($N_2$). The deposited silicon oxycarbide layers may have dielectric constants of about 3 or less.

A preferred silicon, oxygen, and carbon layer is deposited in one embodiment by supplying trimethylsilane or 1,3,5,7-tetramethylcyclotetrasiloxane to a plasma processing chamber at a flow rate between about 10 and about 1000 standard cubic centimeters per minute (sccm) with an oxidizing gas supplied to the processing chamber at a flow rate between about 10 sccm and about 1000 sccm. An inert gas, such as helium, argon, or combinations thereof, is also supplied to the chamber at a flow rate between about 50 sccm and about 5000 sccm. The chamber pressure is maintained between about 100 milliTorr and about 15 Torr. The substrate surface temperature is maintained between about 100° C. and about 450° C. during the deposition process.

The organosilicon compound, the oxidizing gas, and the inert gas, are introduced to the processing chamber via a gas distribution plate spaced between about 200 millimeters (mm) and about 600 millimeters from the substrate on which the silicon carbide layer is being deposited upon. Power from a single 13.56 MHz RF power source is supplied to the chamber 10 to form the plasma at a power density between about 0.3 watts/cm$^2$ and about 3.2 watts/cm$^2$, or a power level between about 100 watts and about 1000 watts for a 200 mm substrate. A power density between about 0.9 watts/cm$^2$ and about 2.3 watts/cm$^2$, or a power level between about 300 watts and about 700 watts for a 200 mm substrate, is preferably supplied to the processing chamber to generate the plasma.

The organosilicon compounds are oxidized during deposition of the silicon oxycarbide layer, preferably by reaction with oxygen ($O_2$), ozone ($O_3$), nitrous oxide ($N_2O$), carbon monoxide (CO), carbon dioxide ($CO_2$), water ($H_2O$), or combinations thereof. When ozone is used as an oxidizing gas, an ozone generator typically converts about 15 wt. % of the oxygen in a source gas to ozone, with the remainder typically being oxygen. However, the ozone concentration may be increased or decreased based upon the amount of ozone desired and the type of ozone generating equipment used. Organosilicon compounds that contain oxygen may be disassociated to provide the oxygen. During deposition of the silicon oxycarbide layer, the substrate is maintained at a temperature between about −20° C. and about 500° C., and preferably is maintained at a temperature between about 170° C. and about 180° C.

For a plasma enhanced deposition of the silicon oxycarbide layer, the organosilicon material is deposited using a power density ranging between about 0.03 W/cm$^2$ and about 6.4 W/cm$^2$, which is a RF power level of between about 10 W and about 2000 W for a 200 mm substrate. Preferably, the RF power level is between about 300 W and about 1700 W. The RF power is provided at a frequency between about 0.01 MHz and 300 MHz. The RF power may be provided continuously or in short duration cycles wherein the power is on at the stated levels for cycles less than about 200 Hz and the on cycles total between about 10% and about 50% of the total duty cycle. The deposition process of the low dielectric constant layer is performed in a substrate processing system described in more detail below. The silicon oxycarbide layer can be deposited continuously or with interruptions, such as changing chambers or providing cooling time, to improve porosity.

In one embodiment of plasma enhanced deposition, oxygen or oxygen containing compounds are dissociated to increase reactivity and achieve desired oxidation of the deposited layer. RF power is coupled to the deposition chamber to increase dissociation of the compounds. The compounds may also be dissociated in a microwave chamber prior to entering the deposition chamber.

Following deposition, the deposited dielectric material may be annealed at a temperature between about 100° C. and about 400° C. for between about 1 minute and about 60 minutes, preferably at about 30 minutes, to reduce the moisture content and increase the solidity and hardness of the dielectric material, if desired. The anneal is preferably performed after the deposition of the next layer which prevents shrinkage or deformation of the dielectric layer. Inert gases, such as argon and helium, may be added to the annealing atmosphere.

The deposited silicon oxycarbide layer may also be plasma treated prior to deposition of photoresist materials thereon. The plasma treatment is believed to remove a portion of the carbon material from the surface of the silicon oxycarbide layer or silicon carbide layer that reduces the surface's reactivity to subsequently deposited materials. The plasma treatment may be performed in the same chamber used to deposit the silicon and carbon containing material.

The plasma treatment generally includes providing an inert gas including helium, argon, neon, xenon, krypton, or combinations thereof, to a processing chamber at a flow rate between about 500 sccm and about 3000 sccm, and generating a plasma in the processing chamber. The plasma may be generated using a power density ranging between about 0.03 W/cm and about 3.2 W/cm$^2$, which is a RF power level of between about 10 W and about 1000 W for a 200 mm substrate. Preferably, a power level of between about 200 watts and about 800 watts is used in depositing the silicon carbide material for a 200 mm substrate. The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle.

The processing chamber is generally maintained at a chamber pressure of between about 3 Torr and about 12 Torr. A chamber pressure between about 7 Torr and about 10 Torr. The substrate is maintained at a temperature between about 300° C. and about 450° C. during the plasma treatment. A substrate temperature between about 350° C. and about 400° C. may be used during the plasma treatment. The plasma treatment may be performed between about 10 seconds and about 100 seconds, with a plasma treatment between about 40 seconds and about 60 seconds preferably used.

The processing gas may be introduced into the chamber by a gas distributor, the gas distributor may be positioned between about 200 mils and about 500 mils from the substrate surface. The showerhead may be positioned between about 300 mils and about 400 mils during the plasma treatment. However, it should be noted that the respective parameters may be modified to perform the plasma processes in various chambers and for different substrate sizes, such as 300 mm substrates.

Alternatively, a silicon carbide layer may be deposited with the silicon oxycarbide layer. The silicon carbide layer is a dielectric material having a dielectric constant (k) of about 6 or less. The silicon carbide material may be deposited before or after deposition of the silicon oxycarbide material, and may be used as a barrier layer, an etch stop, or an antireflective coating.

An amorphous carbon layer is then deposited on the low k dielectric material. In one embodiment, a gas mixture of a hydrocarbon compound, and, optionally, an inert gas, such as argon (Ar) or helium (He), is introduced into a processing chamber. The hydrocarbon compound has a formula $C_xH_y$, where x has a range of between 2 and 4 and y has a range of between 2 and 10. For example, propylene ($C_3H_6$), propyne ($C_3H_4$), propane ($C_3H_8$), butane ($C_4H_{10}$), butylene ($C_4H_8$), butadiene ($C_4H_6$), or acetelyne ($C_2H_2$) as well as combinations thereof, may be used as the hydrocarbon compound. Alternatively, partially or completely fluorinated derivatives of the hydrocarbon compounds, for example, $C_3F_8$ or $C_4F_8$, may be used to deposit a fluorinated amorphous carbon layer, which may be described as an amorphous fluorocarbon layer. A combination of hydrocarbon compounds and fluorinated derivatives of hydrocarbon compounds may be used to deposit the amorphous carbon layer or amorphous fluorocarbon layer.

Similarly, a variety of gases such as hydrogen ($H_2$), nitrogen ($N_2$), ammonia ($NH_3$), or combinations thereof, among others, may be added to the gas mixture to modify properties of the amorphous carbon material. Argon, helium, and nitrogen are used to control the density and deposition rate of the amorphous carbon layer. The addition of $H_2$ and/or $NH_3$ can be used to control the hydrogen ratio of the amorphous carbon layer to control layer properties, such as reflectivity.

The amorphous carbon layer is then deposited from the processing gas using the following deposition process parameters. The substrate is maintained at a substrate temperature between about 100° C. and about 500° C., a chamber pressure is maintained between about 1 Torr and about 20 Torr, the hydrocarbon gas ($C_xH_y$) has a flow rate between about 50 sccm and about 500 sccm for a 200 mm substrate, a plasma is generated by applying a RF power of between about 3 W/cm$^2$ and about 20 W/cm$^2$, or between about 1000 watts (w) and about 6000 W for a 200 mm substrate, with a gas distributor being between about 300 mils and about 600 mils from the substrate surface. The above process parameters provide a typical deposition rate for the amorphous carbon layer in the range of about 100 Å/min to about 1000 Å/min and can be implemented on a 200 mm substrate in a deposition chamber, such as the DxZ™ processing chamber commercially available from Applied Materials, Inc. The applied RF power may be varied based upon the substrate size and the equipment used, for example, the applied RF power may be between about 19 W/cm$^2$ and about 130 W/cm$^2$. The amorphous carbon deposition values provided herein are illustrative and should not be construed as limiting the scope of the invention.

The amorphous carbon layer comprises carbon and hydrogen atoms, which may be an adjustable carbon:hydrogen ratio that ranges from about 10% hydrogen to about 60% hydrogen. Controlling the hydrogen ratio of the amorphous carbon layer is desirable for tuning the respective optical properties, etch selectivity and chemical mechanical polishing resistance properties. Specifically, as the hydrogen content decreases the optical properties of the as-deposited layer such as for example, the index of refraction (n) and the absorption coefficient (k) increase. Similarly, as the hydrogen content decreases the etch resistance of the amorphous carbon layer increases.

The light absorption coefficient, k, of the amorphous carbon layer can be varied between about 0.1 to about 1.0 at wavelengths below about 250 nm, such as between about 193 nm and about 250 nm, making the amorphous carbon layer suitable for use as an anti-reflective coating (ARC) at DUV wavelengths. The absorption coefficient of the amorphous carbon layer can be varied as a function of the deposition temperature. In particular, as the temperature increases the absorption coefficient of the as-deposited layer likewise increases. For example, when propylene is the hydrocarbon compound the k value for the as-deposited amorphous carbon layers can be increased from about 0.2 to about 0.7 by increasing the deposition temperature from about 150° C. to about 480° C.

The absorption coefficient of the amorphous carbon layer can also be varied as a function of the additive used in the gas mixture. In particular, the presence of hydrogen ($H_2$), ammonia ($NH_3$), and nitrogen ($N_2$), or combinations thereof, in the gas mixture can increase the k value by about 10% to about 100%. The amorphous carbon layer is further described in U.S. patent application Ser. No. 09/590,322, filed on Jun. 8, 2000, entitled, "Method for Depositing an Amorphous Carbon Layer", which is incorporated herein to the extent not inconsistent with the claimed aspects and description herein.

Removal of the amorphous carbon material from the low k dielectric material may be achieved by subjecting the amorphous carbon layer to a plasma of a hydrogen-containing gas. The plasma of the hydrogen-containing gas is believed to remove the amorphous carbon material with minimal change on the dielectric constant of the low k material disposed thereunder and reduced or minimal surface defect formation.

The plasma treatment generally includes providing the hydrogen containing gas including hydrogen, ammonia, water vapor ($H_2O$), or combinations thereof, to a processing chamber at a flow rate between about 100 sccm and about 1000 sccm, preferably between about 500 sccm and about 1000 sccm, and generating a plasma in the processing chamber. The plasma may be generated using a power density ranging between about 0.15 W/cm$^2$ and about 5 W/cm$^2$, which is a RF power level of between about 50 W and about 1500 W for a 200 mm substrate. The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle.

The processing chamber is generally maintained at a chamber pressure of between about 1 Torr and about 10 Torr, preferably between about 3 Torr and about 8 Torr. The substrate is maintained at a temperature between about 100° C. and about 300° C. during the plasma treatment, preferably, between about 200° C. and about 300° C. The plasma treatment may be performed between about 15 seconds and about 120 seconds, or as necessary to remove the amorphous carbon material. The processing gas may be introduced into the chamber by a gas distributor, the gas distributor may be positioned between about 100 mils and about 2000 mils from the substrate surface, preferably positioned between about 200 mils and about 1000 mils, during the plasma treatment. However, it should be noted that the respective parameters may be modified to perform the plasma processes in various chambers and for different substrate sizes, such as 300 mm substrates.

A suitable reactor for performing the low k deposition, the amorphous carbon material deposition, and the hydrogen-containing gas plasma removal of the amorphous carbon materials described herein may be performed in a DxZ™ chemical vapor deposition chamber commercially available from Applied Materials, Inc., Santa Clara, Calif.

Deposition of a Dual Damascene Structure

An example of a damascene structure that is formed using the low k dielectric silicon, oxygen, and carbon material, the amorphous carbon material, and the amorphous carbon material removal process described herein is shown in FIGS. 1A–G, which are cross sectional views of a substrate having the steps of the invention formed thereon.

As shown in FIG. 1A, a silicon carbide barrier layer 110 is deposited on the substrate surface to eliminate inter-level diffusion between the substrate and subsequently deposited material. The substrate surface may comprise metal features 107 formed in a dielectric material 105. The silicon carbide barrier layer 110 may be doped with oxygen, boron, phosphorus, or combinations thereof.

A first dielectric layer 112, comprising silicon, oxygen, and carbon, as described herein is deposited on the silicon carbide barrier layer 110 on the substrate surface including metal features 107 formed in a dielectric material 105. The first dielectric layer 112 of interlayer dielectric material is deposited on the first silicon carbide barrier layer 110 by oxidizing an organosilane or organosiloxane, such as trimethylsilane, to a thickness of about 5,000 to about 15,000 Å, depending on the size of the structure to be fabricated.

An example of a low dielectric constant material that may be used as an interlayer dielectric material is Black Diamond™ dielectric material commercially available from Applied Materials, Inc., of Santa Clara, Calif. Alternatively, the first dielectric layer may also comprise other low k dielectric material such as a low k polymer material including paralyne or a low k spin-on glass such as un-doped silicon glass (USG) or fluorine-doped silicon glass (FSG). A plasma process following deposition as described herein for the silicon oxycarbide layer may then treat the first dielectric layer 112.

A low k etch stop (or second barrier layer) 114 of a silicon carbide material or oxidized organo silane layer is then deposited on the first dielectric layer 112 to a thickness of about 200 to about 1000 Å. Alternatively, the etch stop 114 may be a nitrogen containing silicon carbide material. The low k etch stop 114 is then pattern etched to define the contact/via openings 116 and to expose first dielectric layer 112 in the areas where the contacts/vias are to be formed as shown in FIG. 1A. Preferably, the low k etch stop 114 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 116 prior to depositing further materials.

After the low k etch stop 114 has been etched to pattern the contacts/vias and the photoresist has been removed, a second dielectric layer 118 of silicon oxycarbide as described herein is deposited to a thickness of about 5,000 to about 15,000 Å as shown in FIG. 1A. The second dielectric layer 118 may also be plasma treated as described herein for the silicon oxycarbide layer.

In an alternative embodiment, a nitrogen-free silicon carbide or silicon oxide cap layer between about 100 Å and about 500 Å thick may be deposited on second dielectric layer 118 prior to depositing additional materials, such as photoresist materials. In a further alternative embodiment, a silicon carbide cap layer (not shown) may be deposited on the second dielectric layer 118 prior to depositing additional materials, such as photoresist materials.

Figure 1B:
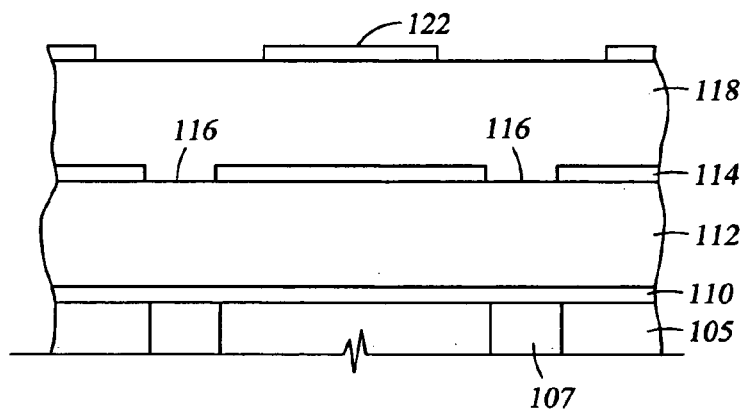

An amorphous carbon layer 122 is then deposited on the second dielectric layer 118 (or cap layer) and patterned preferably using conventional photolithography processes to define the interconnect lines 120 as shown in FIG. 1B. The amorphous carbon layer 122 is deposited as described herein. Typically, the amorphous carbon layer has a thickness in the range of about 50 Å to about 1000 Å.

The amorphous carbon layer 122 is a hardmask which may perform as a stop for chemical mechanical polishing techniques to allow removal of conductive material while protecting low k dielectric materials, such as the second dielectric layer 118, from damage during etching or from polishing methods.

Figure 1C:
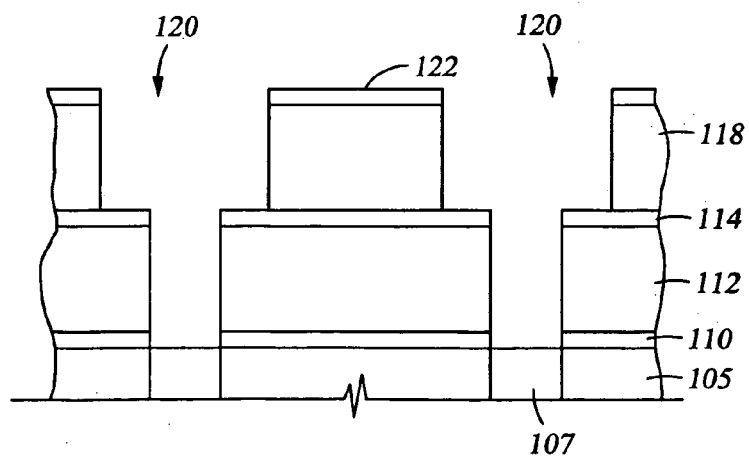
Figure 1D:
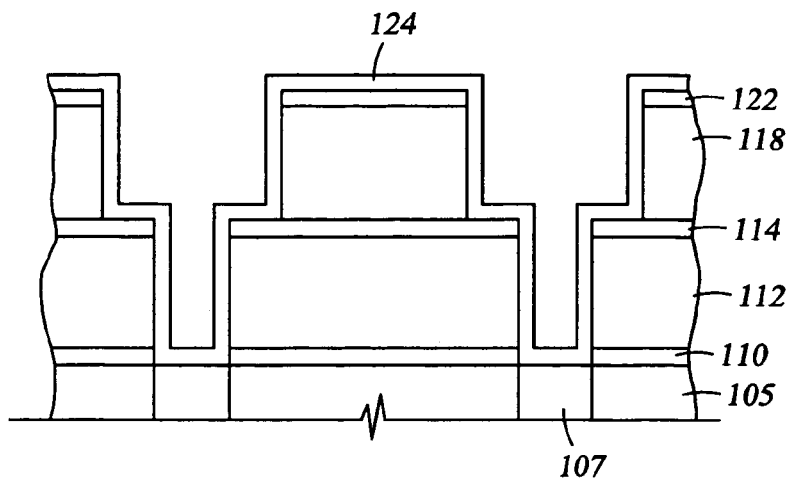
Figure 1E:
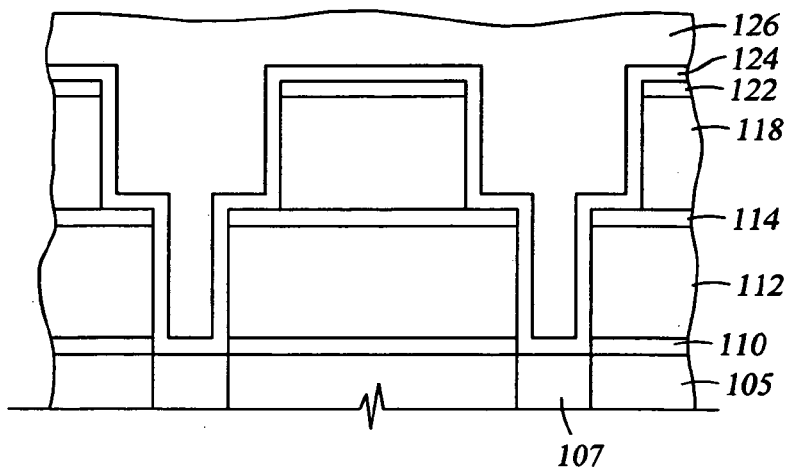

The features are then etched through the second dielectric layer 118, the low k etch stop 114, the first dielectric layer 112, and the silicon carbide barrier layer 110 as shown in FIG. 1C. The interconnect lines 120 are filed to form a metallization structure with a conductive material such as aluminum, copper, tungsten or combinations thereof. Presently, the trend is to use copper to form the smaller features due to the low resistivity of copper (1.7 mW-cm compared to 3.1 mW-cm for aluminum). Preferably, as shown in FIG. 1D, a suitable barrier layer 124 such as tantalum or tantalum nitride is first deposited conformally in the metallization pattern to prevent copper migration into the surrounding silicon and/or dielectric material. Thereafter, copper 126 is deposited using either chemical vapor deposition, physical vapor deposition, electroplating, or combinations thereof to fill the structure as shown in FIG. 1E.

Figure 1F:
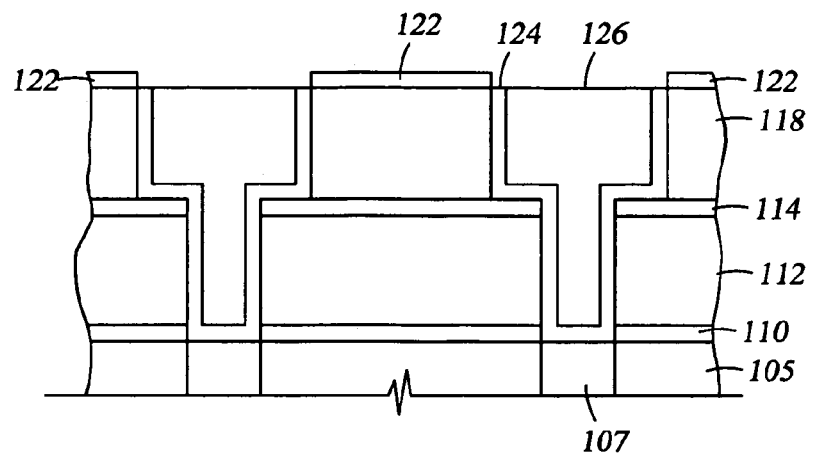
Figure 1G:
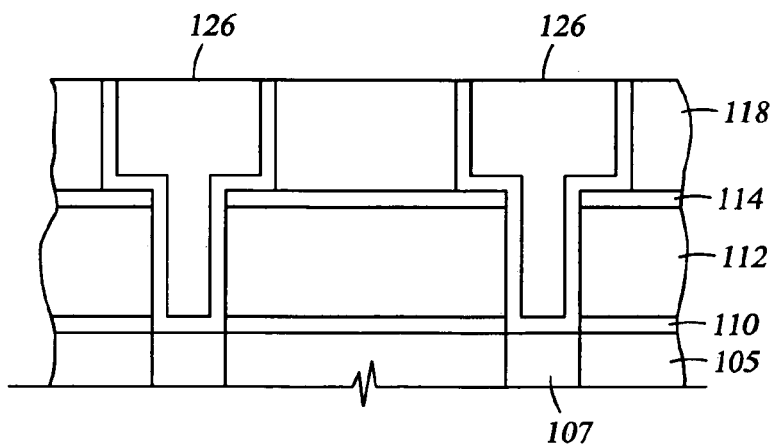

Once the structure has been filled with copper or other metal, the surface is planarized using chemical mechanical polishing to remove any excess copper 126 and barrier layer 124 materials. However, the polishing resistant amorphous carbon layer 122 remains behind after the polishing process as shown in FIG. 1F. The amorphous carbon layer has a selectivity, or removal rate ratio, of conductive material, either copper or barrier layer materials, to amorphous carbon of greater than about 1:1, such as between about 5:1 and about 30:1, and can include removal rate ratios of greater than 30:1.

The amorphous carbon layer 122 is then exposed to a plasma of a hydrogen-containing gas to remove the amorphous containing material from the surface of the substrate. An example of the hydrogen-containing plasma removal process may be performed by introducing hydrogen gas at a flow rate of about 1000 sccm, maintaining a chamber pressure of about 5 Torr, maintaining a substrate temperature at about 250° C., generating a plasma by supplying a RF power level of between about 100 W and about 300 W for a 200 mm substrate, and maintaining the plasma for about 60 seconds, or as necessary to remove the amorphous carbon material. The gas distributor is positioned about 500 mils from the substrate surface during the plasma treatment.

While the foregoing is directed to preferred embodiments of the present invention, other and further embodiments of the invention may be devised without departing from the basic scope thereof, and the scope thereof is determined by the claims that follow.

What is claimed is:

1. A method for processing a substrate in a deposition chamber, comprising:
    depositing at least one dielectric layer on a substrate surface, wherein the dielectric layer comprises at least silicon and carbon and has a dielectric constant of about 6 or less;
    forming one or more amorphous carbon layers on the at least one dielectric layer by a process comprising:
        providing a gas mixture to the deposition chamber, wherein the gas mixture comprises hydrogen gas and one or more hydrocarbon compounds;
        applying a RF power to generate a plasma; and
        depositing the one or more amorphous carbon layers; and
    removing the one or more amorphous carbon layers by exposing the one or more amorphous carbon layers to a plasma of a hydrogen gas.

2. The method of claim 1, wherein the one or more hydrocarbon compounds are selected from the group consisting of propylene ($C_3H_6$), propyne ($C_3H_4$), propane ($C_3H_8$), butane ($C_4H_{10}$), butylene ($C_4H_8$), butadiene ($C_4H_6$), acetelyne ($C_2H_2$), partially fluorinated derivatives thereof, fully fluorinated derivatives thereof, and combinations thereof.

3. The method of claim 1, wherein the plasma of the hydrogen gas is generated by applying a power level between about 0.15 watts/cm$^2$ and about 5 watts/cm$^2$ to the deposition chamber.

4. The method of claim 3, wherein the applying a RF power comprises applying between about 3 W/in$^2$ to about 20 W/in$^2$ to generate a plasma.

5. The method of claim 1, wherein removing the one or more amorphous carbon layers comprises introducing a hydrogen gas into the deposition chamber at a flow rate of about 5000 sccm or less, maintaining the deposition chamber at a pressure of between about 1 Torr and about 10 Torr, maintaining the substrate temperature between about 100° C. and about 300° C., generating the plasma by supplying a power level between about 50 watts and about 1500 watts to the deposition chamber for a 200 mm substrate, and maintaining the plasma between about 10 seconds and about 120 seconds.

6. The method of claim 1, wherein the one or more hydrocarbon compounds comprise propylene ($C_3H_6$), acetylene ($C_2H_2$), or combinations thereof.

7. The method of claim 1, wherein forming one or more amorphous carbon layers further comprises a deposition temperature from 150° C. to about 480° C. and maintaining the deposition chamber at a pressure between about 1 Torr to about 20 Torr.

8. The method of claim 1, wherein the gas mixture further comprises an inert gas selected from the group consisting of helium, argon, and combinations thereof.

9. A method for processing a substrate, comprising:
    depositing at least one dielectric layer on a substrate surface, wherein the dielectric layer comprises at least silicon and carbon and has a dielectric constant of about 6 or less;
    forming one or more amorphous carbon layers on the at least one dielectric layer by a process comprising:
        providing a gas mixture to a deposition chamber, wherein the gas mixture comprises hydrogen gas and one or more hydrocarbon compounds having the general formula $C_xH_y$, wherein x has a range of 2 to 4 and y has a range of 2 to 10;
        applying a RF power between about 3 W/in$^2$ to about 20 W/in$^2$ to generate a plasma; and
        depositing the one or more amorphous carbon layers;
    defining a pattern in at least one region of the one or more amorphous carbon layers;
    forming feature definitions in the at least one dielectric layer by the pattern formed in the at least one region of the one or more amorphous carbon layers;
    depositing one or more conductive materials in the feature definitions;
    polishing the one or more conductive materials and stopping on the one or more amorphous carbon layers; and
    removing the one or more amorphous carbon layers by exposing the one or more amorphous carbon layers to a plasma of a hydrogen-containing gas.

10. The method of claim 9, wherein the one or more hydrocarbon compounds are selected from the group consisting of propylene ($C_3H_6$), propyne ($C_3H_4$), propane ($C_3H_8$), butane ($C_4H_{10}$), butylene ($C_4H_8$), butadiene ($C_4H_6$), acetelyne ($C_2H_2$), partially fluorinated derivatives thereof, fully fluorinated derivatives thereof, and combinations thereof.

11. The method of claim 9, wherein the plasma of the hydrogen gas is generated by applying a power level between about 0.15 watts/cm$^2$ and about 5 watts/cm$^2$ to the deposition chamber.

12. The method of claim 11, wherein the one or more amorphous carbon layers are exposed to the plasma for between about 10 seconds and about 120 seconds.

13. The method of claim 9, wherein removing the one or more amorphous carbon layers comprises introducing a hydrogen gas into the deposition chamber at a flow rate of about 5000 sccm or less, maintaining the deposition chamber at a pressure of between about 1 Torr and about 10 Torr, maintaining the substrate temperature between about 100° C. and about 300° C., generating the plasma by supplying a power level between about 50 watts and about 1500 watts to the deposition chamber for a 200 mm substrate, and maintaining the plasma between about 10 seconds and about 120 seconds.

14. The method of claim 9, wherein the one or more hydrocarbon compounds comprise propylene ($C_3H_6$), acetylene ($C_2H_2$), or combinations thereof.

15. The method of claim 9, wherein forming one or more amorphous carbon layers further comprises a deposition temperature from 150° C. to about 480° C. and maintaining the deposition chamber at a pressure between about 1 Torr to about 20 Torr.

16. The method of claim 9, wherein the gas mixture further comprises an inert gas selected from the group consisting of helium, argon, and combinations thereof.

17. The method of claim 9, wherein the one or more conductive materials and the one or more amorphous carbon layers are removed at a ratio of conductive materials to amorphous carbon of greater than about 1:1.

18. A method for processing a substrate, comprising:
 positioning a substrate in a deposition chamber;
 providing a gas mixture to the deposition chamber, wherein the gas mixture comprises hydrogen and one or more hydrocarbon compounds selected from the group of propylene ($C_3H_6$), acetylene ($C_2H_2$), and combinations thereof;
 maintaining a deposition temperature from 150° C. to about 480° C.;
 applying a RF power to generate a plasma;
 depositing one or more amorphous carbon layers; and
 removing the one or more amorphous carbon layers by exposing the one or more amorphous carbon layers to a plasma of a hydrogen gas.

19. The method of claim 18, wherein the gas mixture further comprises an inert gas selected from the group consisting of helium, argon, and combinations thereof.

20. The method of claim 18, further comprising maintaining the deposition chamber at a pressure between about 1 Torr to about 20 Torr.

* * * * *